United States Patent
Moon et al.

(10) Patent No.: US 7,547,607 B2
(45) Date of Patent: Jun. 16, 2009

(54) METHODS OF FABRICATING INTEGRATED CIRCUIT CAPACITORS USING A DRY ETCHING PROCESS

(75) Inventors: Kwang-jin Moon, Gyeonggi-do (KR); Gil-Heyun Choi, Gyeonggi-do (KR); Sang-Woo Lee, Seoul (KR); Jae-Hwa Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 438 days.

(21) Appl. No.: 11/176,519

(22) Filed: Jul. 7, 2005

(65) Prior Publication Data

US 2006/0030116 A1    Feb. 9, 2006

(30) Foreign Application Priority Data

Aug. 4, 2004    (KR)    .................. 10-2004-0061424

(51) Int. Cl.
*H01L 21/20* (2006.01)

(52) U.S. Cl. .................. 438/386; 438/399; 438/255; 438/649; 438/664; 438/682; 257/307; 257/308; 257/309

(58) Field of Classification Search ................ 438/597; 257/486, 740, 751, 767, E21.021
See application file for complete search history.

(56) References Cited

U.S. PATENT DOCUMENTS

| | | | | |
|---|---|---|---|---|
| 5,545,592 A * | 8/1996 | Iacoponi | .................. | 438/655 |
| 5,846,881 A * | 12/1998 | Sandhu et al. | .............. | 438/683 |
| 5,926,737 A * | 7/1999 | Ameen et al. | ............... | 438/649 |
| 5,972,722 A * | 10/1999 | Visokay et al. | ................. | 438/3 |
| 6,130,128 A * | 10/2000 | Lin | ............................ | 438/253 |
| 6,204,170 B1 * | 3/2001 | Taguwa | ...................... | 438/649 |
| 6,265,262 B1 * | 7/2001 | Okuno et al. | .............. | 438/253 |
| 6,271,075 B1 * | 8/2001 | Fukui | ......................... | 438/239 |
| 6,653,186 B2 | 11/2003 | Won et al. | | |
| 6,881,642 B2 * | 4/2005 | Basceri et al. | .............. | 438/386 |
| 6,984,874 B2 * | 1/2006 | Givens et al. | ............... | 257/621 |
| 7,164,165 B2 * | 1/2007 | Basceri et al. | .............. | 257/295 |

(Continued)

FOREIGN PATENT DOCUMENTS

JP    10-308360    11/1998

(Continued)

OTHER PUBLICATIONS

Notice to Submit Response corresponding to Korean Patent Application No. 10-2004-0061424 mailed Feb. 28, 2006.

*Primary Examiner*—N Drew Richards
*Assistant Examiner*—Ankush k Singal
(74) *Attorney, Agent, or Firm*—Myers Bigel Sibley & Sajovec, P.A.

(57) ABSTRACT

A method of fabricating an integrated circuit capacitor includes forming a first metal layer on a conductive plug in an interlayer insulating layer on a substrate. At least a portion of the first metal layer is silicided to form a metal silicide layer and a remaining first metal layer on the conductive plug. The remaining first metal layer is removed using a dry etching process. A lower electrode including a second metal layer is then formed on the metal silicide layer. Because the remaining first metal layer is removed, etching and/or other damage to the conductive plug and/or the interlayer insulating layer during a subsequent wet etching process may be reduced and/or prevented.

10 Claims, 9 Drawing Sheets

U.S. PATENT DOCUMENTS

| | | | |
|---|---|---|---|
| 7,304,367 B2 * | 12/2007 | Choi et al. | 257/532 |
| 2003/0199152 A1 * | 10/2003 | Derraa | 438/471 |
| 2004/0175920 A1 * | 9/2004 | Derderian et al. | 438/620 |
| 2004/0227175 A1 * | 11/2004 | Iijima et al. | 257/309 |
| 2005/0020066 A1 * | 1/2005 | Choi et al. | 438/683 |

FOREIGN PATENT DOCUMENTS

| | | |
|---|---|---|
| KR | 2002-0052483 A | 7/2002 |
| KR | 2002-0084596 A | 11/2002 |
| KR | 2003-0055789 A | 7/2003 |

\* cited by examiner

METHODS OF FABRICATING INTEGRATED CIRCUIT CAPACITORS USING A DRY ETCHING PROCESS

CROSS-REFERENCE TO RELATED APPLICATION

This application claims priority from Korean Patent Application No. 10-2004-0061424, filed on Aug. 4, 2004, in the Korean Intellectual Property Office, the disclosure of which is hereby incorporated by reference herein in its entirety.

BACKGROUND OF THE INVENTION

1. Field of the Invention

The present invention relates to methods of fabricating integrated circuit capacitors, and more particularly, to methods of fabricating integrated circuit capacitors having a cylindrical-shaped lower electrodes.

2. Description of the Related Art

As the integration density of integrated circuit and/or semiconductor memory devices increases, the devices may be scaled-down, and as such, the area of a unit memory cell in a memory device may also be reduced. However, even though a capacitor in a memory cell of a dynamic random access memory (DRAM) device may be reduced in size, a minimum capacitance may be required to provide the desired input, output, and/or data reproduction characteristics, which may seriously affect the design of memory cell capacitors. In order to fabricate capacitors to meet minimum capacitance requirements even at reduced sizes, various structures for capacitor lower electrodes, such as relatively tall and/or three dimensional structures, have been proposed. For example, a cylindrical-shaped lower electrode may offer advantages by increasing the effective area of a capacitor. As such, various cylindrical-shaped lower electrode structures and formation methods have been proposed, such as those described in U.S. Pat. No. 6,653,186 to Won et al.

Generally, in order to form a cylindrical-shaped lower electrode, a silicon nitride etch stop layer and a mold oxide layer may be formed on a semiconductor substrate including a buried contact plug therein. The mold oxide layer and the etch stop layer may be sequentially dry-etched to form a mold oxide pattern and an etch stop pattern exposing the buried contact plug. Then, using the mold oxide pattern, the cylindrical-shaped lower electrode may be formed on the contact plug and on sidewalls of the mold oxide pattern. After the lower electrode is formed, the mold oxide pattern may be removed by a wet etch.

However, in conventional methods of forming cylindrical-shaped lower electrodes, the etchant used to remove the mold oxide pattern may flow into the interface between the lower electrode and the etch stop layer, and may thereby damage the lower structure.

More particularly, where a titanium nitride (TiN) cylindrical-shaped lower electrode is formed on a polysilicon contact plug, it is known to form a Ti layer on the contact plug and silicide the Ti layer to form a TiSi$_2$ layer on the contact plug before depositing the TiN for the lower electrode. This may decrease interface resistance between the TiN of the lower electrode and the polysilicon layer of the contact plug. However, as the entire Ti layer may not be silicided, a portion of the Ti layer may remain between the lower electrode and the etch stop layer. As such, the remaining Ti layer may be etched when the mold oxide pattern is removed after forming the lower electrode, and the etchant may flow between the lower electrode and the etch stop layer. As a result, the polysilicon contact plug in the interlayer insulating layer may be etched, which may result in defects.

SUMMARY OF THE INVENTION

The present invention provides methods of fabricating integrated circuit capacitors which may prevent and/or reduce damage to a lower structure (such as an interlayer insulating layer and/or a contact plug) by preventing an etchant from flowing into the lower structure during a wet etch process for removing a mold oxide layer pattern.

According to some embodiments of the present invention, a method of fabricating an integrated circuit capacitor may include forming a first metal layer on a conductive plug in an interlayer insulating layer on a substrate. At least a portion of the first metal layer may be silicided to form a metal silicide layer and a remaining first metal layer on the conductive plug. The remaining first metal layer may be removed using a dry etching process, and then a lower electrode including a second metal layer may be formed on the metal silicide layer.

In some embodiments, the first metal layer may include titanium (Ti), and the second metal layer may include titanium nitride (TiN). The remaining first metal layer may be removed by etching the remaining first metal layer using a TiCl$_4$ etching gas and/or an inert gas.

In other embodiments, at least a portion of the first metal layer may be silicided concurrently with forming the first metal layer.

In some embodiments, the first metal layer may be formed in a first chamber, and the remaining first metal layer may be removed in the first chamber without vacuum break between forming the first metal layer and removing the remaining first metal layer. The first chamber may be purged after siliciding the first metal layer and before removing the remaining first metal layer. The lower electrode may be formed in the first chamber without vacuum break between removing the remaining first metal layer and forming the lower electrode. The first chamber may also be purged after removing the remaining first metal layer and before forming the lower electrode.

In other embodiments, the method may further include nitrifying the substrate after removing the remaining first metal layer and before forming the lower electrode.

In some embodiments, the method may further include forming a mold pattern on the interlaying insulating layer. The mold pattern may have an opening therein exposing the conductive plug. The lower electrode may be formed by forming the second metal layer on the conductive plug and on sidewalls of the opening to define the lower electrode. In other embodiments, the mold pattern may be removed, and a dielectric layer may be formed on a lower surface and sidewalls of the lower electrode. An upper electrode may then be formed on the dielectric layer.

According to some embodiments of the present invention, a method of fabricating an integrated circuit capacitor may include forming a mold pattern having an opening therein exposing a polysilicon contact plug in an interlaying insulating layer on a substrate. A TiCl$_4$ gas may be introduced to the substrate in a first vacuum chamber to form a Ti layer on the polysilicon contact plug and on sidewalls of the opening of the mold pattern. At least a portion of the Ti layer on the polysilicon contact plug may be silicided to form a TiSi$_2$ layer and a remaining Ti layer on the polysilicon contact plug. A TiCl$_4$ gas may then be introduced to the substrate to remove the remaining Ti layer using a dry etching process. Then, a TiN layer may be formed on the TiSi$_2$ layer and on sidewalls of the opening of the mold pattern to define a U-shaped lower electrode.

In some embodiments, forming a mold pattern may include forming an etch stop layer on the interlayer insulating layer, forming a mold oxide layer on the etch stop layer, and removing a portion of the etch stop layer and the mold oxide layer to expose the polysilicon contact plug in the interlayer insulating layer. The etch stop layer may extend from the interlayer insulating layer beyond the TiSi$_2$ layer on the polysilicon contact plug.

In other embodiments, introducing a TiCl$_4$ gas to the substrate to form the Ti layer may include introducing an H$_2$ and/or Ar gas to the substrate along with the TiCl4 gas to form the Ti layer. The TiCl4 gas, the H$_2$ gas, and/or the Ar gas may be introduced to the substrate using a plasma-enhanced chemical vapor deposition (PECVD) process at a temperature of about 600 to 650 C to concurrently form the Ti layer and the TiSi$_2$ layer.

In some embodiments, introducing a TiCl$_4$ gas to the substrate to remove the remaining Ti layer may include introducing an Ar gas to the substrate along with the TiCl$_4$ gas to remove the remaining Ti layer.

In other embodiments, the TiCl$_4$ gas may be introduced to the substrate in the first vacuum chamber to remove the remaining Ti layer. The TiN layer may also be formed in the first vacuum chamber to define the U-shaped lower electrode. A first purge process may be performed to remove remaining gases in the first vacuum chamber after siliciding at least a portion of the Ti layer and before introducing the TiCl$_4$ gas to remove the remaining Ti layer. For example, the first purge process may be performed to remove H$_2$ and/or H* gases remaining in the first chamber. In addition, a second purge process may be performed to remove remaining gases in the first vacuum chamber after introducing the TiCl4 gas to remove the remaining Ti layer and before forming the TiN layer. Moreover, an NH3 gas and/or an N2 gas may be introduced to the substrate in the first vacuum chamber to nitrify the substrate after introducing the TiCl$_4$ gas to remove the remaining Ti layer and before performing the second purge process.

In other embodiments, the mold pattern may be removed using a buffered oxide etchant (BOE) and/or a diluted hydrofluoric acid (DHF) etchant. A dielectric layer may be formed on a lower surface and sidewalls of the U-shaped lower electrode. An upper electrode may then be formed on the dielectric layer.

Thus, according to some embodiments of the present invention, methods of fabricating an integrated circuit capacitor may prevent and/or reduce etching and/or damage to a lower structure including the conductive plug and/or the interlayer insulating layer by removing remaining (unsilicided) portions of the first metal layer using a dry etching process.

DETAILED DESCRIPTION OF EMBODIMENTS OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items, and may be abbreviated as "/".

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

FIGS. 1A through 1J are cross-sectional sectional views illustrating intermediate fabrication steps in methods of fabricating integrated circuit capacitors according to some embodiments of the present invention.

Figure 1A:
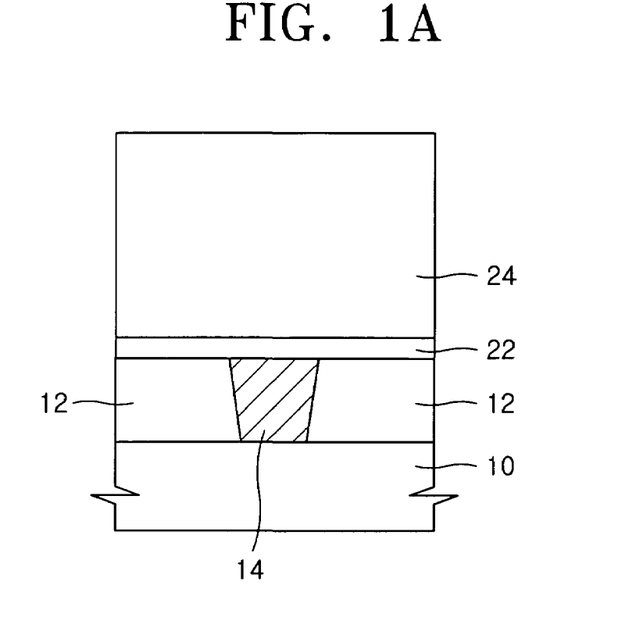
FIGS. 1A through 1J are cross-sectional views illustrating intermediate fabrication steps in exemplary methods of fabricating integrated circuit capacitors according to some embodiments of the present invention.

Referring to FIG. 1A, an interlayer insulating layer 12 is formed on a semiconductor substrate 10. The interlayer insulating layer 12 is partially etched, thereby forming a storage node contact hole. A conductive material, such as doped polysilicon is then formed in the contact hole and is planarized, thereby forming a buried conductive contact plug 14 connected to an active region of the semiconductor substrate 10.

An etch stop layer 22, which may be formed of silicon nitride, and a mold oxide layer 24, which may be formed of silicon oxide, are then formed on the interlayer insulating layer 12 and the contact plug 14.

Figure 1B:
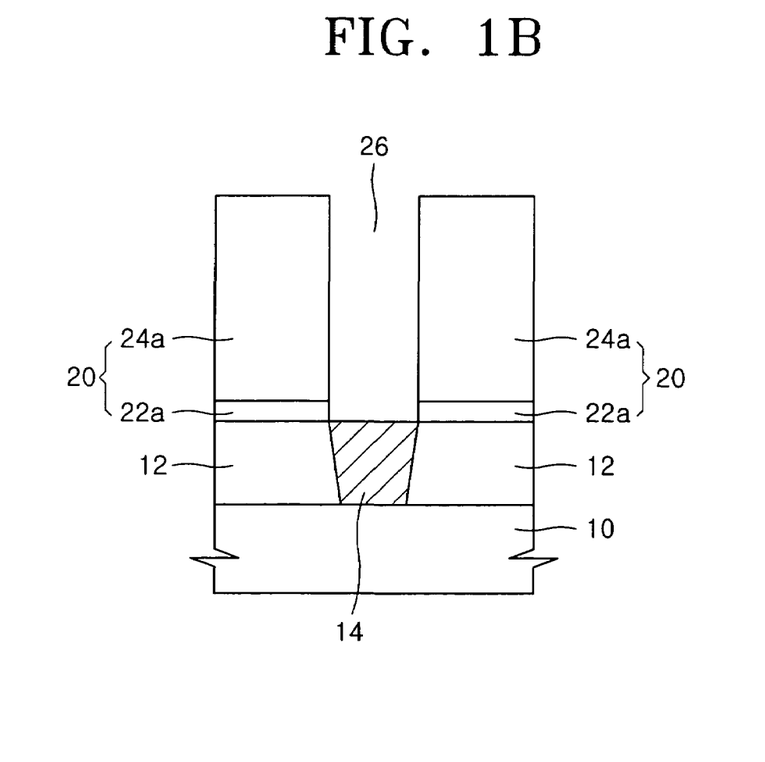

Referring to FIG. 1B, using a photoresist pattern (not shown) as an etch mask, the mold oxide layer 24 and the etch stop layer 22 are sequentially etched, thereby forming an etch stop pattern 22a and a mold oxide pattern 24a. The etch stop pattern 22a and the mold layer pattern 24a form a mold pattern 20 for forming a cylindrical-type lower electrode. The mold pattern 20 defines an opening 26 exposing the contact plug 14.

Figure 1C:
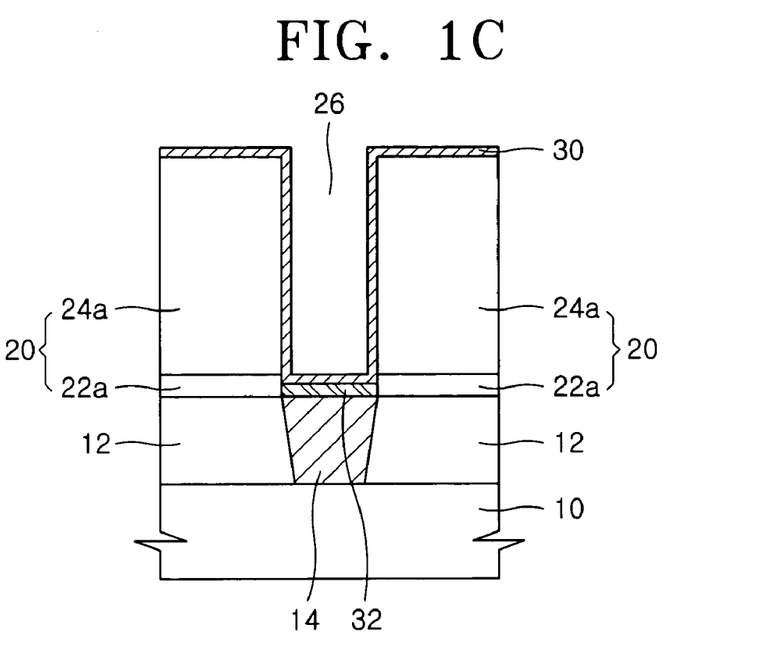

Referring to FIG. 1C, a first metal layer 30 is formed on the upper surface and inner sidewalls of the mold pattern 20, including on inner surfaces of the opening 26 and on the contact plug 14. The first metal layer 30 may be formed using chemical vapour deposition (CVD), atomic layer deposition (ALD), plasma-enhanced chemical vapor deposition (PECVD), and/or cyclic CVD methods. Where a Ti layer is formed as the first metal layer 30 using a TiCl$_4$ source gas, it may be preferable to use a PECVD method, as PECVD may be appropriate for use in a relatively low-temperature deposition process. More particularly, the deposition temperature of the first metal layer 30 may be about 400 to 700° C., and the deposition pressure may be about 1 to 5 torr.

The first metal layer 30 on the contact plug 14 is then silicided, thereby forming a metal silicide layer 32 on the surface of the contact plug 14. More particularly, the metal silicide layer 32 is formed by annealing the first metal layer 30. Thus, the polysilicon of the contact plug 14 and the metal of the first metal layer 30 react with each other to form the metal silicide layer 32 on the surface of the contact plug 14.

In some embodiments, the metal silicide layer 32 can be formed concurrently along with the first metal layer 30. To do so, the first metal layer 30 may be formed at a deposition temperature of about 600 to 650° C. As such, a separate annealing process to silicide the first metal layer 30 may not be necessary. Thus, the metal silicide layer 32 can be formed concurrently with the formation of the first metal layer 30 on the surface of the contact plug 14 in a high temperature atmosphere of about 600 to 650° C.

For example, the first metal layer 30 may be formed of titanium (Ti). To form a Ti first metal layer, TiCl$_4$ (as a Ti source gas), H$_2$, and Ar gases are supplied on the semiconductor substrate 10 inside a PECVD process chamber, which is maintained at a temperature of about 600 to 650° C. and at a pressure of about 1 to 5 Torr. As a result, a TiSi$_2$ layer is concurrently formed as the metal silicide layer 32 on the surface of the contact plug 14.

Figure 1D:
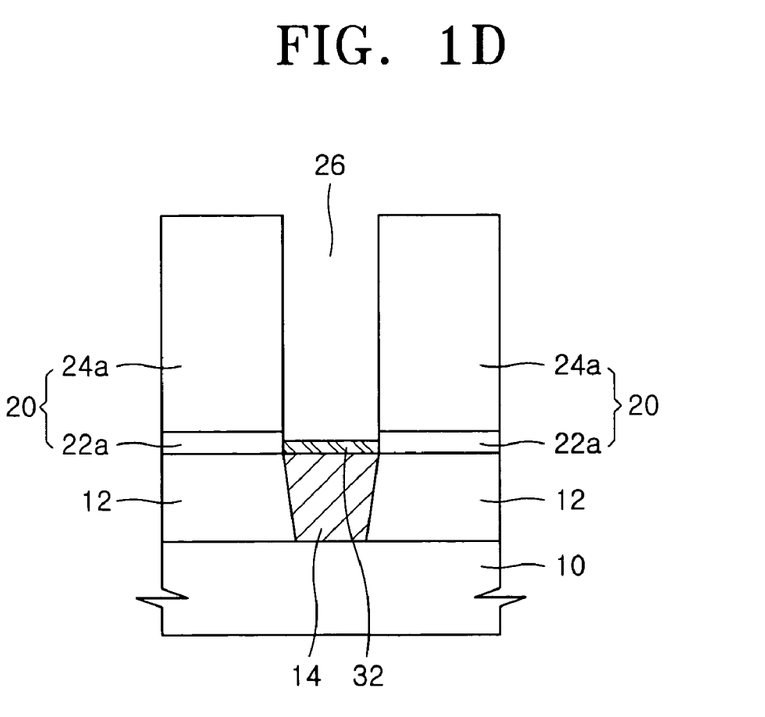

Referring to FIG. 1D, a portion of the first metal layer 30 which is not silicided is then removed using a dry etch.

Where the first metal layer 30 is formed of a Ti layer, the portion of the first metal layer 30 which is not silicided can be removed by introducing a TiCl$_4$ gas as an etch gas on the semiconductor substrate 10. To remove the first metal layer 30, only the TiCl$_4$ gas may be introduced, or alternatively an inert gas such as Ar or N$_2$ gas may be introduced along with the TiCl$_4$ gas as an etch gas. When the TiCl$_4$ gas is introduced on the semiconductor substrate 10, the Ti of the first metal layer 30 and the TiCl$_4$ gas react with each other as shown in the formula (EQ 1) below, so that the remaining Ti layer which is not silicided can be selectively etched.

$$Ti + TiCl_4 \rightarrow TiCl_x (x=1\sim3) \tag{EQ1}$$

The amount of the Ti layer that is etched by the TiCl$_4$ gas may depend on the flow rate and supply time of the TiCl$_4$ gas and the temperature of the semiconductor substrate. In some embodiments according to the present invention, the amount of the Ti layer etched by the TiCl$_4$ gas is less than about 10 per second.

The process for removing the first metal layer 30 may be performed in-situ, inside the same chamber where the first metal layer 30 was formed without vacuum break between forming the first metal layer 30 and removing remaining portions of the first metal layer 30. To perform the removal process in-situ, the chamber is first purged to remove any H$_2$ or H* gas remaining inside the chamber after forming the first metal layer 30 and/or the metal silicide layer 32. The process for removing the first metal layer 30 is then performed.

Alternatively, the process for removing the first metal layer 30 may be performed in a different chamber from the one where the first metal layer 30 was formed, such as a chamber to be used in a subsequent process for forming a capacitor lower electrode. In some embodiments, the process of forming the lower electrode may be performed in-situ inside the same chamber where the first metal layer 30 is formed and then removed, without vacuum break between removing remaining portions of the first metal layer 30 and forming the lower electrode 50a.

After the first metal layer 30 is removed, the metal silicide layer 32 on the contact plug 14 inside the opening 26 is exposed, as shown in FIG. 1D.

Figure 1E:
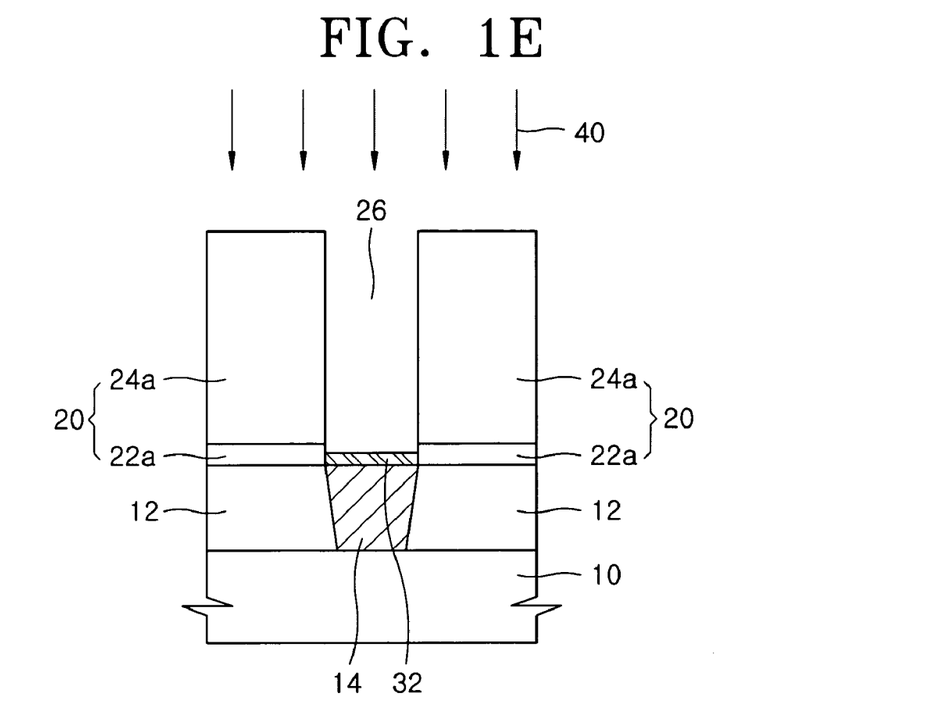

Referring now to FIG. 1E, a nitrogen-containing gas 40, for example, NH$_3$ or N$_2$ gas, is introduced on the semiconductor substrate 10 from which the first metal layer 30 was removed, thereby nitrifying the exposed upper surface of the semiconductor substrate 10, and more particularly, the exposed surface of the mold pattern 20. When the second metal layer (for the lower electrode) is formed inside the opening 26 and on the upper surfaces and inner sidewalls of the mold pattern 20 during a subsequent process, the nitrified surface may prevent impurities from penetrating into and/or damaging the metal layer for the lower electrode. For example, where the first metal layer 30 is formed of a Ti layer, the Ti layer may be formed thicker on upper surfaces of the mold pattern 20 than inside the opening 26 due to step coverage characteristics in the deposition of the Ti layer. As such, as described above with reference to FIG. 1D, the Ti layer may not be completely removed from the upper surface of the mold pattern 20. In other words, portions of the Ti layer may remain even after the removal of the first metal layer 30. Moreover, impurities, such as Cl atoms, in the second metal layer for the lower electrode (formed in a subsequent process), may penetrate into the Ti layer remaining on the mold pattern 20 and may thereby cause fatal defects. Thus, as shown in FIG. 1E, a nitrogen-containing gas, such as, an NH$_3$ gas, may be used to nitrify the surface of the remaining Ti layer and thereby form a blocking thin film to prevent impurities inside the second metal layer from penetrating into the Ti layer. The nitridation process described with reference to FIG. 1E may be selectively performed, and can be omitted in some embodiments.

Figure 1F:
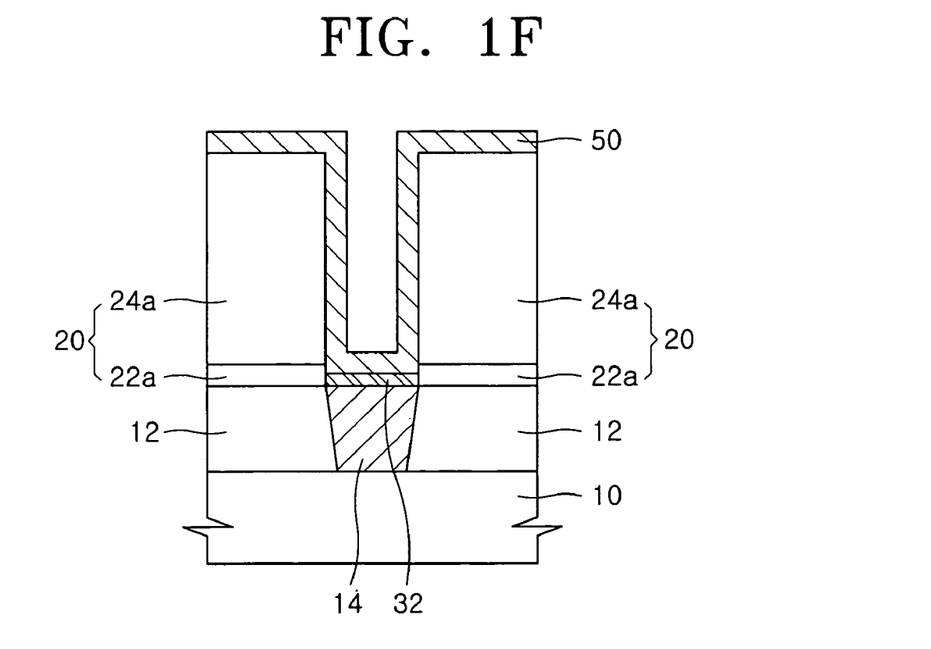

Referring now to FIG. 1F, a second metal layer 50 is formed on the upper surfaces and inner sidewalls of the mold pattern 20 and on the exposed surface of the metal silicide layer 32 inside the opening 26, forming a capacitor lower electrode on inner surfaces of the opening 26. The second metal layer 50 may be formed of TiN, or alternatively, a platinum group noble metal such as Pt, Ru, or Ir.

The second metal layer 50 may be formed using CVD, ALD, PECVD, and/or cyclic CVD methods. For example, the second metal layer 50 may be formed using a thermal CVD method having excellent step coverage characteristics. More particularly, if the second metal layer 50 is to be formed of TiN, TiCl$_4$ and NH$_3$ gases and an inert gas, such as N$_2$, may be introduced to the semiconductor substrate 10 in a thermal CVD chamber to form the TiN layer on the semiconductor substrate 10. The chamber may be maintained at a temperature of about 600 to 700° C. and at a pressure of about 2 to 5 torr.

As described above with reference to FIG. 1D, the process for forming the second metal layer 50 may be performed in-situ, inside the same process chamber where the first metal layer 30 is removed without vacuum break, after the removal of the first metal layer 30. Further, as described above with reference to FIG. 1E, if necessary, a nitridation process may be performed after removing the first metal layer 30 inside the thermal CVD chamber, and the second metal layer 50 may be formed thereafter in the same chamber.

Figure 1G:
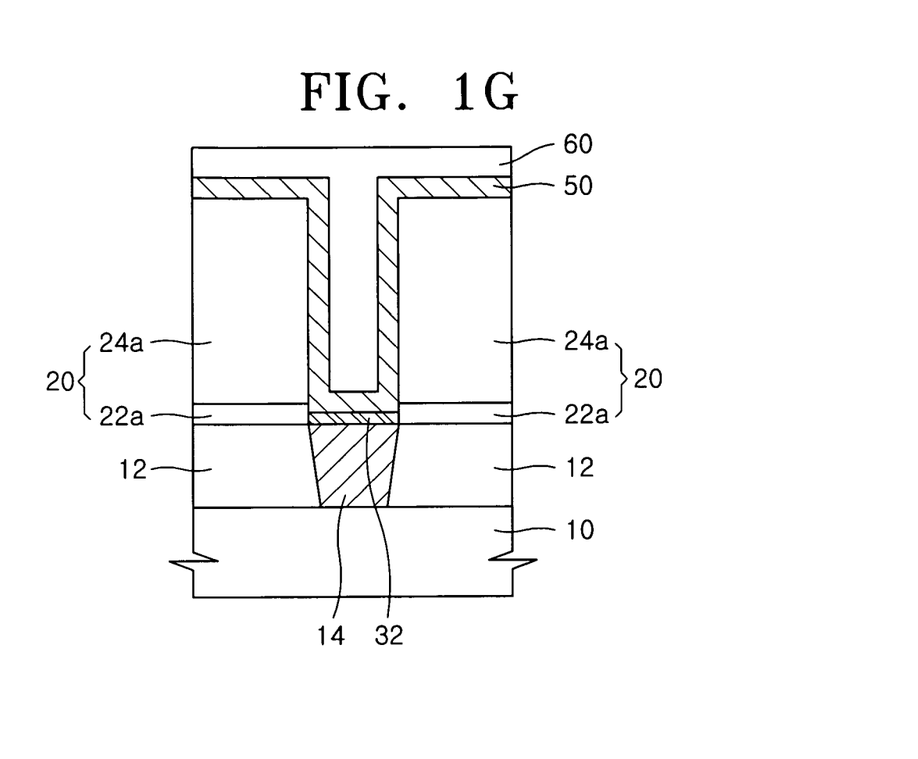

Referring to FIG. 1G, a sacrificial layer 60 is formed on the second metal layer 50 to fill the opening 26. The sacrificial layer 60 may be formed, for example, of an oxide.

Figure 1H:
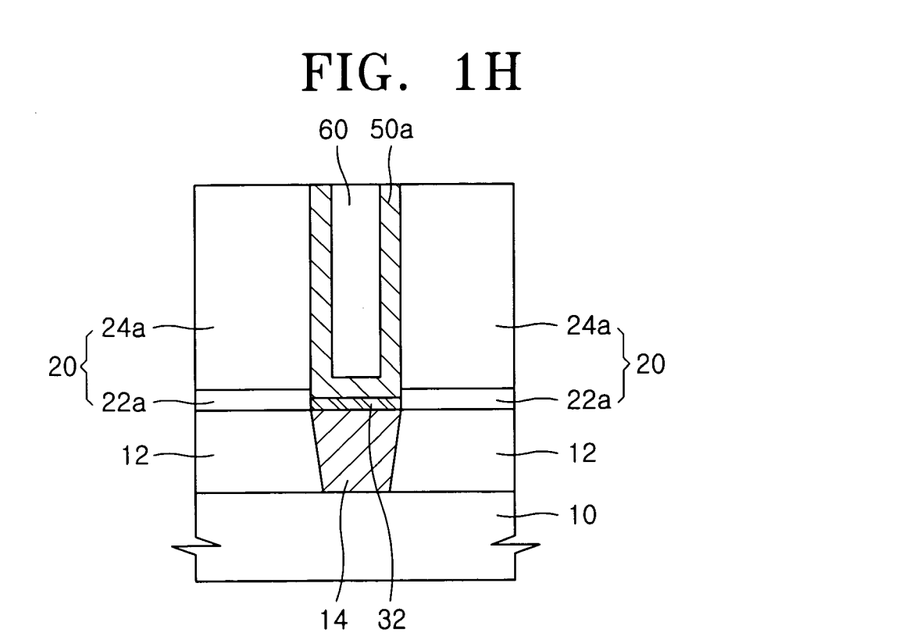

Referring to FIG. 1H, using a chemical mechanical polishing (CMP) and/or etchback process, the sacrificial layer 60 and the second metal layer 50 on the top surface of the mold pattern 20 are removed, thereby forming a node-separated lower electrode 50a.

Figure 1I:
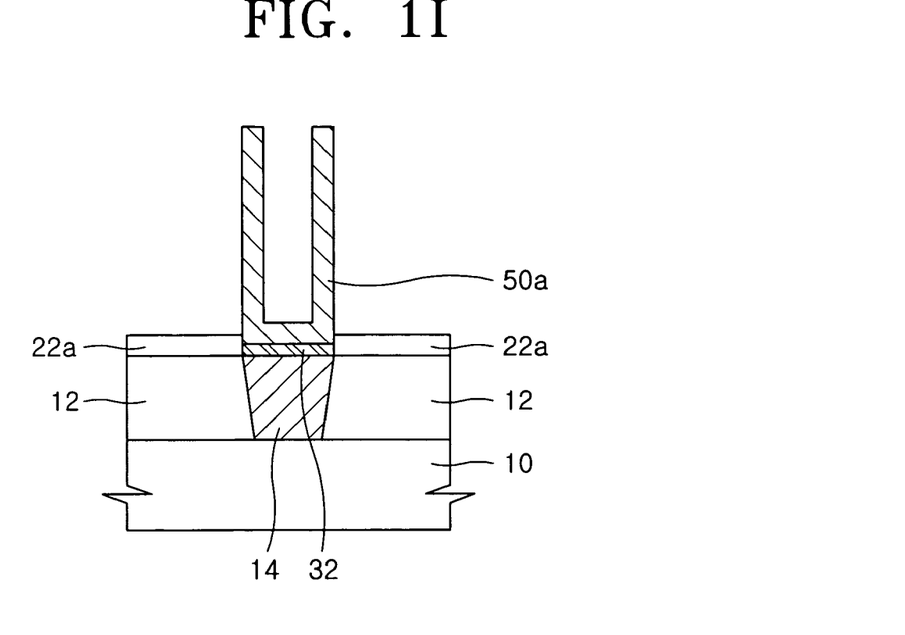

Referring to FIG. 1I, the mold oxide pattern 24a of the mold pattern 20, and the sacrificial layer 60 are removed using a wet etch method. For example, a buffered oxide etchant (BOE) or diluted hydrofluoric acid (DHF) may be used as an etchant for the wet etch. Where DHF is used, a Ti layer may be vulnerable and/or may be easily etched by the DHF etchant. However, since the Ti layer was removed (as shown in FIG. 1D) and is therefore not present around the mold oxide pattern 24a, there is no passage through which the etchant may flow into the lower structure. As such, the lower structure including the interlayer insulating layer 12 and/or the contact plug 14 may not be damaged.

Figure 1J:
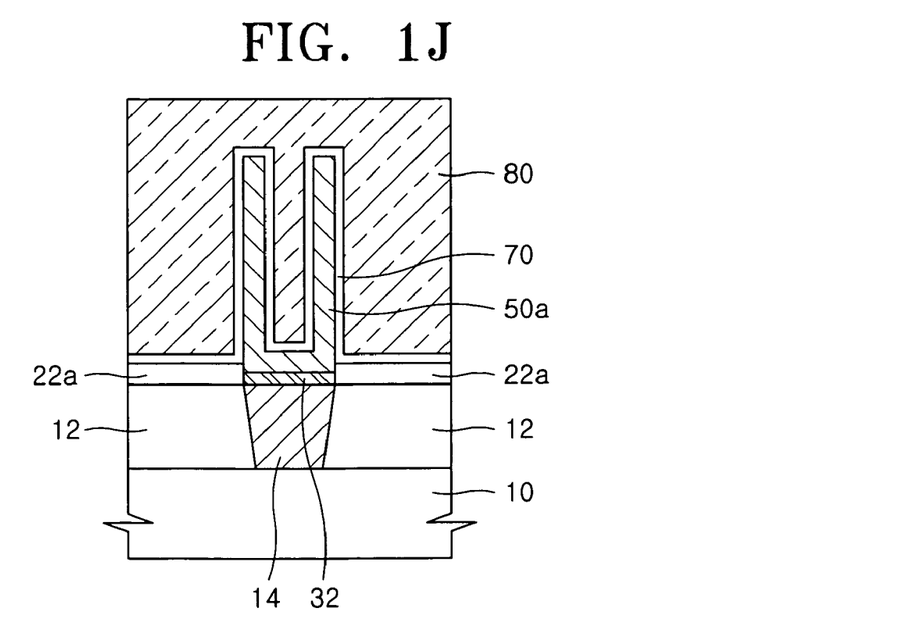

Referring to FIG. 1J, a dielectric layer 70 and an upper electrode 80 are then sequentially formed on the lower electrode 50a, thereby completing the formation of the integrated circuit capacitor.

Figure 2A:
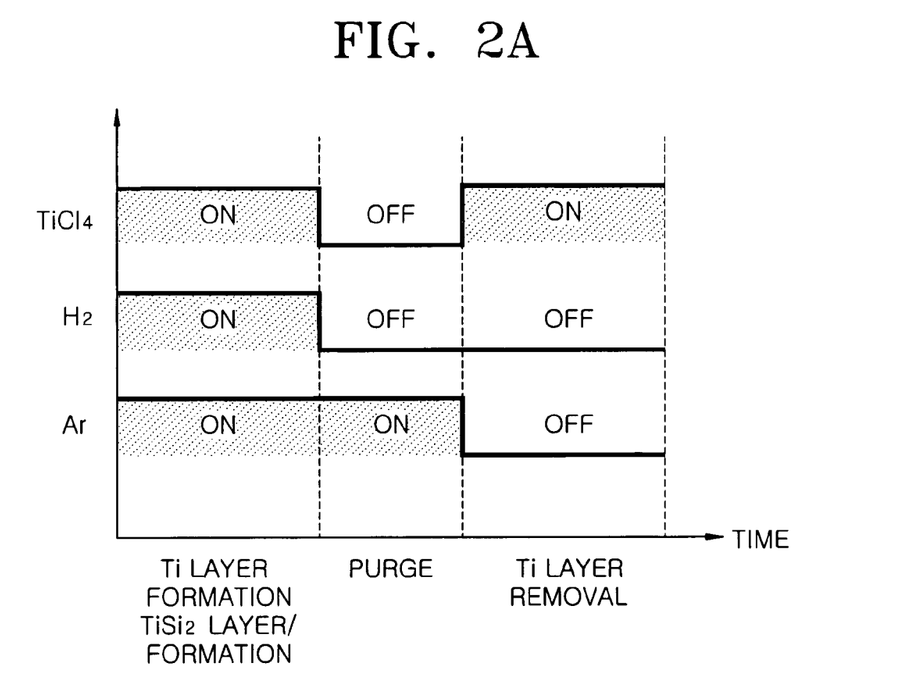
FIG. 2A is a timing diagram illustrating exemplary gas supply states inside a chamber where a first metal layer is formed in methods of fabricating integrated circuit capacitors according to some embodiments of the present invention.

FIG. 2A is a timing diagram illustrating an exemplary gas supply states where the first metal layer 30 is formed and then removed inside the same chamber, as described above with reference to FIG. 1D. In FIG. 2A, a Ti layer forms the first metal layer 30. Although FIG. 2A illustrates a case in which a purge process is performed after the Ti layer is formed, the purge process can be performed between other and/or every intermediate fabrication step in other embodiments.

Figure 2B:
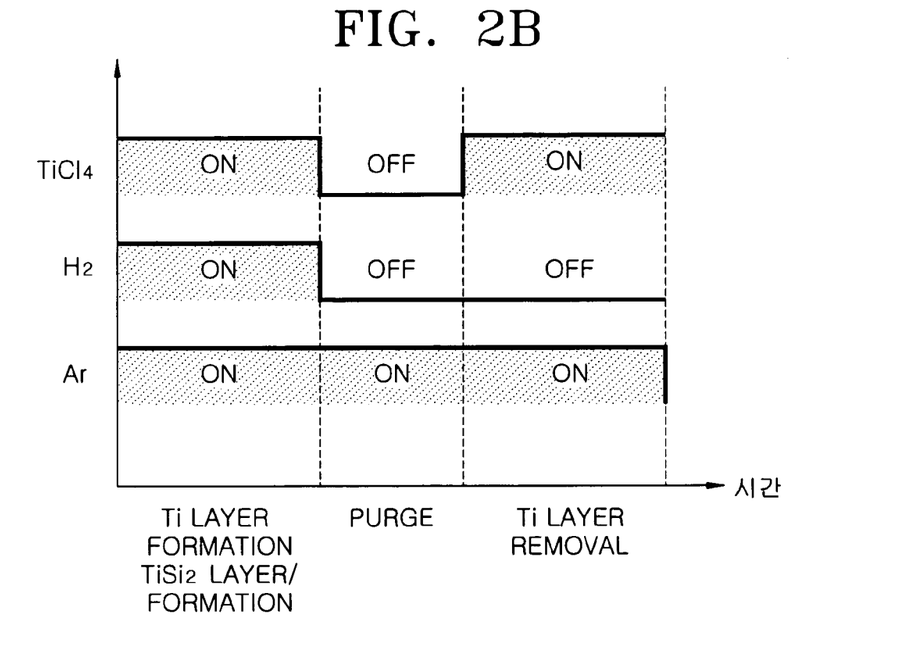
FIG. 2B is a timing diagram illustrating additional exemplary gas supply states inside a chamber where a first metal layer is formed in methods of fabricating integrated circuit capacitors according to some embodiments of the present invention.

FIG. 2B is a timing diagram illustrating additional exemplary gas supply states where the first metal layer 30 is formed and removed inside the same chanmber as described above with reference to FIG. 1D. However, in FIG. 2B, an inert Ar gas is introduced along with the TiCl$_4$ gas in the removal of the Ti layer. The example of FIG. 2B is otherwise similar to that of FIG. 2A.

Figure 3A:
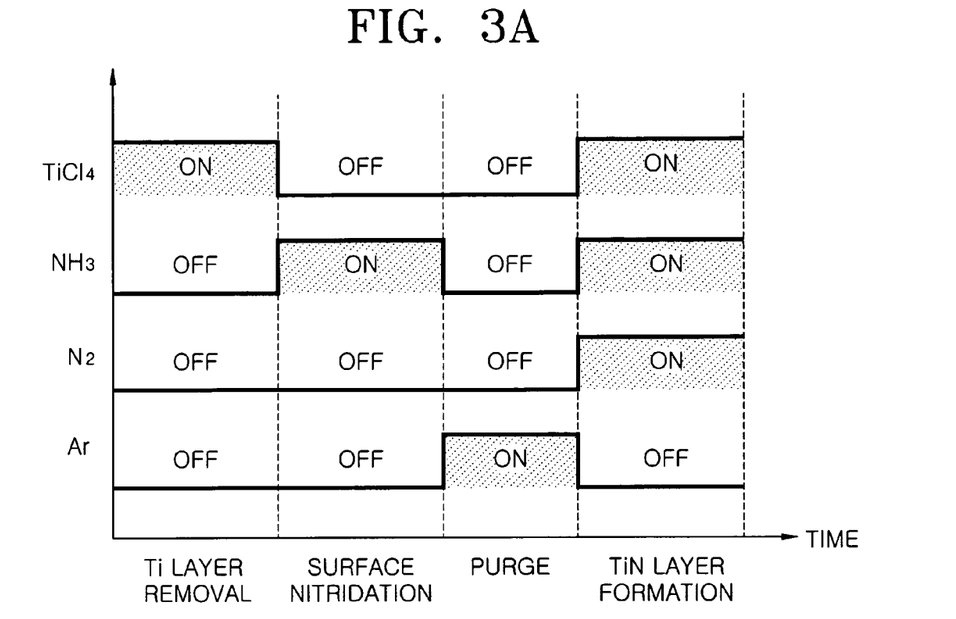
FIG. 3A is a timing diagram illustrating exemplary gas supply states inside a chamber where a second metal layer is formed in methods of fabricating integrated circuit capacitors according to some embodiments of the present invention.

FIG. 3A is a timing diagram illustrating an exemplary gas supply states where the second metal layer 50 is formed after removing the first metal layer 30 inside the same chamber as described above with reference to FIG. 1D. In FIG. 3A, the first metal layer 30 is formed of Ti, and the second metal layer 50 is formed of TiN. Although FIG. 3A illustrates a case where a purge process is performed after the process of the surface nitridation, the purge process can be performed between other and/or all intermediate fabrication steps in some embodiments.

Figure 3B:
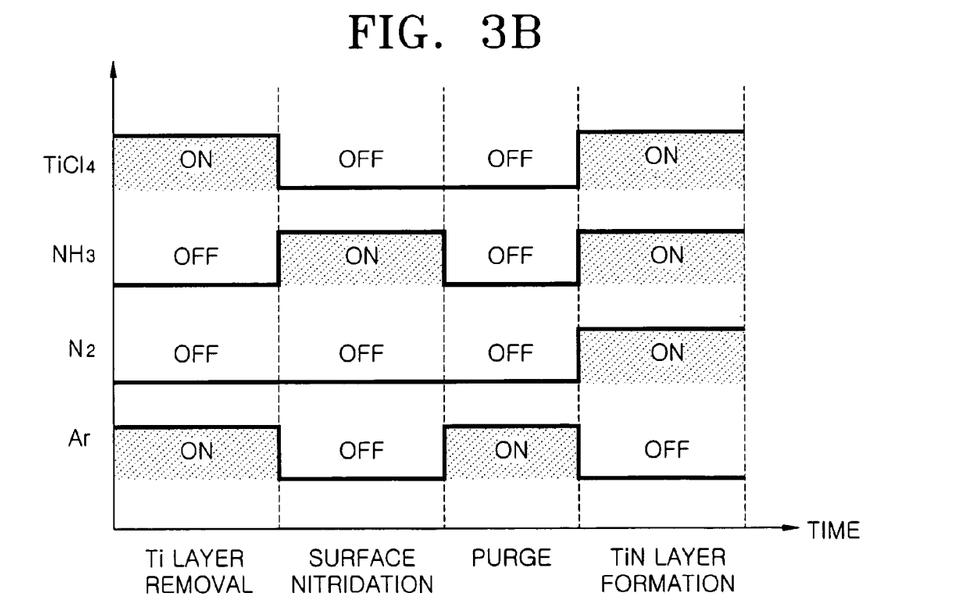
FIG. 3B is a timing diagram illustrating additional exemplary gas supply states inside a chamber where a second metal layer is formed in methods of fabricating integrated circuit capacitors according to some embodiments of the present invention.

FIG. 3B is a timing diagram illustrating additional exemplary gas supply states where the second metal layer 50 is formed after removing the first metal layer 30 inside the same chamber as described above with reference to FIG. 1D. However, in FIG. 3B, an inert Ar gas is introduced along with the TiCl$_4$ gas in the removal of the Ti layer. The example of FIG. 3B is otherwise similar to that of FIG. 3A.

Figure 4:
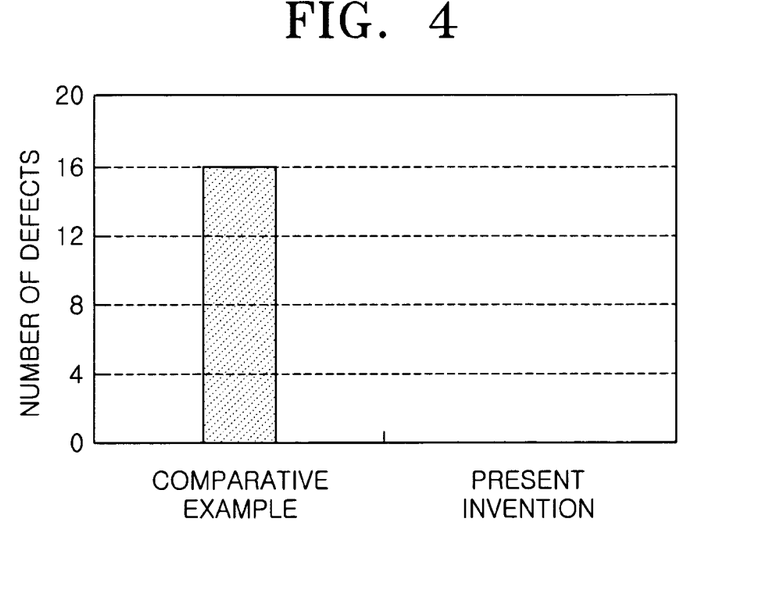
FIG. 4 is a graph illustrating the number of the defects generated when forming a capacitor on a semiconductor substrate according to methods of fabricating integrated circuit capacitors according to some embodiments of the present invention as compared with a conventional example.

FIG. 4 illustrates the number of the defects due to etching of the polysilicon contact plug 14 in a chip fabricated according to some embodiments of the present invention as described above with reference to FIGS. 1A through 1J. In FIG. 4, the first metal layer 30 is formed of Ti, the metal silicide layer 32 is formed of TiSi$_2$, the Ti layer is removed through a dry etch using a TiCl$_4$ gas, and the mold oxide layer pattern 24a and the sacrificial layer 60 are removed through a wet etch using the DHF etchant. As a comparative example, FIG. 4 also illustrates the number of the defects found in a chip fabricated by conventional methods where the Ti layer is not removed by a dry etch using a TiCl$_4$ gas.

As shown in FIG. 4, few and/or no defects may be found inside a chip fabricated by methods according to some embodiments of the present invention, which include the process of performing a dry etch using a TiCl$_4$ gas to remove the unsilicided Ti layer after the Ti layer and the TiSi$_2$ layer are formed.

Figure 5:
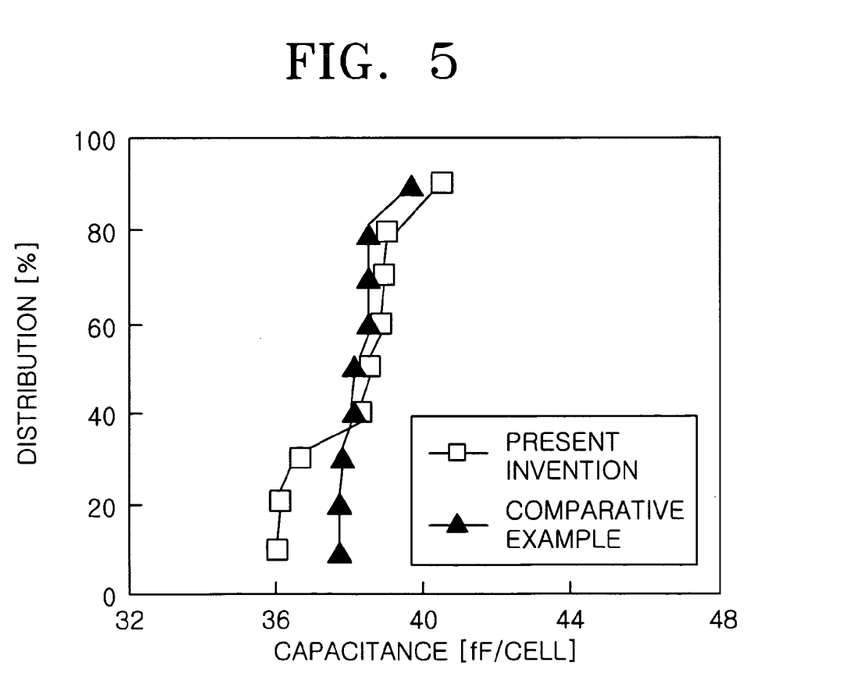
FIG. 5 is a graph illustrating capacitance characteristics of a capacitor formed according to methods of fabricating integrated circuit capacitors according to some embodiments of the present invention as compared with a conventional example.

FIG. 5 illustrates the capacitances of capacitors fabricated using methods according to some embodiments of the present invention as compared with conventional methods described above with reference to FIG. 4. As shown in the results of FIG. 5, desired capacitance characteristics can be achieved by methods according to some embodiments of the present invention, which include the process of performing a dry etch using a TiCl$_4$ gas to remove the unsilicided Ti layer after the Ti layer and the TiSi$_2$ layer are formed. As illustrated in FIG. 5, the capacitance characteristics may be little affected.

Figure 6:
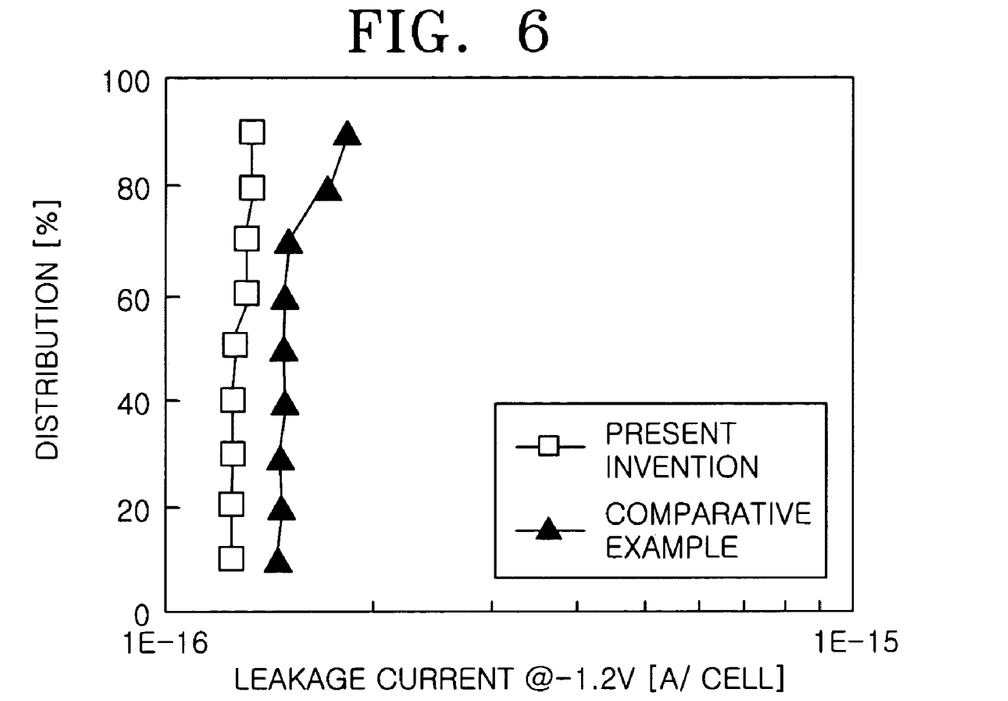
FIG. 6 is a graph illustrating leakage current characteristics of a capacitor formed according to methods of fabricating integrated circuit capacitors according to some embodiments of the present invention as compared with a conventional example.

FIG. 6 illustrates leakage currents of capacitors fabricated using methods according to some embodiments of the present invention as compared with conventional methods described above with reference to FIG. 4. As shown in the results of FIG. 6, where a dry etch using a TiCl$_4$ gas is used to remove the unsilicided Ti layer after the Ti layer and the TiSi$_2$ layer are formed, improved leakage current characteristics can be achieved as compared with conventional capacitors.

In order to form cylindrical-shaped capacitor lower electrodes using methods of fabricating integrated circuit capacitors according to some embodiments of the present invention, a first metal layer is formed on a conductive region exposed by an opening in a mold pattern. The first metal layer is silicided to form a metal silicide layer on the conductive region. Portions of the first metal layer which are not silicided are then removed using a dry etching process. By removing the remaining portions of the first metal layer, etching and/or damage to the conductive region and/or other portions of the lower structure may be prevented or reduced. In contrast, in the prior art, the remaining portions of the first metal layer may provide a passage for etchant flow into the lower structure during a subsequent wet etch process for removing the mold pattern, which may damage the lower structure. Since the remaining portions of the first metal layer are removed using a dry etch in embodiments according to the present invention, the process of removing the first metal layer can be performed in-situ inside the same chamber where the first metal layer and the lower electrode are formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed is:

1. A method of fabricating an integrated circuit capacitor, the method comprising:
   forming a first metal layer on a conductive plug in an interlayer insulating layer on a substrate;
   siliciding at least a portion of the first metal layer to form a metal silicide layer and a remaining first metal layer on the conductive plug;
   substantially removing the remaining first metal layer using a dry etching process such that at least a portion thereof remains;
   nitrifying the portion of the remaining first metal layer; and then
   forming a lower electrode comprising a second metal layer on the metal silicide layer.

2. The method of claim 1, wherein the first metal layer comprises Ti, wherein the second metal layer comprises TiN, and wherein removing the remaining first metal layer comprises:
   etching the remaining first metal layer using a TiCl$_4$ etching gas.

3. The method of claim 1, wherein siliciding at least a portion of the first metal layer comprises:
   siliciding the at least a portion of the first metal layer concurrently with forming the first metal layer.

4. The method of claim 1, wherein forming the first metal layer is performed in a first chamber, and wherein removing the remaining first metal layer comprises:
   removing the remaining first metal layer in the first chamber without vacuum break between forming the first metal layer and removing the remaining first metal layer.

5. The method of claim 1, further comprising:
   forming a mold pattern on the interlaying insulating layer having an opening therein exposing the conductive plug,
   wherein forming a lower electrode comprises forming the second metal layer on the conductive plug and on sidewalls of the opening to define the lower electrode.

6. The method of claim 2, wherein removing the remaining first metal layer further comprises:
   etching the remaining first metal layer using the TiCl$_4$ etching gas and an inert gas.

7. The method of claim 4, further comprising:
   purging the first chamber using an inert gas after siliciding the first metal layer and before removing the remaining first metal layer.

8. The method of claim 4, wherein forming the lower electrode comprises:
   forming the lower electrode in the first chamber without vacuum break between removing the remaining first metal layer and forming the lower electrode.

9. The method of claim 8, further comprising:
   purging the first chamber using an inert gas after removing the remaining first metal layer and before forming the lower electrode.

10. The method of claim 5, further comprising:
    removing the mold pattern;
    forming a dielectric layer on a lower surface and sidewalls of the lower electrode; and
    forming an upper electrode on the dielectric layer.

* * * * *